United States Patent
Majima

(10) Patent No.: US 12,072,368 B2
(45) Date of Patent: Aug. 27, 2024

(54) DETERIORATION CHECKING APPARATUS AND DETERIORATION CHECKING

(71) Applicants: Kabushiki Kaisha Toshiba, Tokyo (JP); Toshiba Electronic Devices & Storage Corporation, Tokyo (JP)

(72) Inventor: Hideaki Majima, Minato Tokyo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 177 days.

(21) Appl. No.: 17/689,729

(22) Filed: Mar. 8, 2022

(65) Prior Publication Data

US 2022/0381814 A1   Dec. 1, 2022

(30) Foreign Application Priority Data

Jun. 1, 2021 (JP) .................. 2021-092445

(51) Int. Cl.
| | |
|---|---|
| G01R 31/26 | (2020.01) |
| G01R 31/28 | (2006.01) |
| H01L 21/66 | (2006.01) |
| H03K 17/687 | (2006.01) |

(52) U.S. Cl.
CPC ..... G01R 31/2623 (2013.01); G01R 31/2621 (2013.01); G01R 31/2884 (2013.01); H03K 17/687 (2013.01); *H01L 22/34* (2013.01); *H01L 2924/00* (2013.01); *H01L 2924/0002* (2013.01)

(58) Field of Classification Search
CPC ............. G01R 31/2623; G01R 31/3277; G01R 31/40; G01R 31/2642; G01R 31/2621; G01R 31/2884; G01R 31/275; H03K 17/687; H03K 17/145; H03K 2217/0027;
(Continued)

(56) References Cited

U.S. PATENT DOCUMENTS

2013/0162284 A1 * 6/2013 Kisslinger da Silva ..................... H03K 17/0822 324/762.09
2016/0341783 A9 * 11/2016 Kisslinger da Silva ..................... G01R 31/2621
2017/0336475 A1 * 11/2017 Wortberg ........... G01R 31/3278
(Continued)

FOREIGN PATENT DOCUMENTS

JP 2020-145576 A 9/2020

*Primary Examiner* — Raul J Rios Russo
(74) *Attorney, Agent, or Firm* — Maier & Maier, PLLC

(57) ABSTRACT

According to one embodiment, a deterioration checking apparatus includes an inductor that is connected in series to a main current path of a MOS transistor to be checked, and forms a closed loop together with the MOS transistor when the MOS transistor is in an ON-state, a control circuit that controls ON/OFF of the MOS transistor, a current sensor that detects a current released from the inductor, and a calculation circuit that calculates an ON-resistance of the MOS transistor from an attenuation characteristic of a current released from the inductor when the MOS transistor is in an ON-state, and calculates a threshold voltage of the MOS transistor from an attenuation characteristic of a current released from the inductor when the MOS transistor is in an OFF-state. Therefore, it is possible to easily check a deterioration state of the MOS transistor.

7 Claims, 14 Drawing Sheets

(58) Field of Classification Search
CPC ............... H03K 17/18; H01L 2924/00; H01L 2924/0002; H01L 22/34
USPC .................................................. 324/762.09
See application file for complete search history.

(56) References Cited

U.S. PATENT DOCUMENTS

2020/0287531 A1    9/2020  Majima
2021/0028778 A1*  1/2021  Aeloiza ............. H03K 17/0822

* cited by examiner

DETERIORATION CHECKING APPARATUS AND DETERIORATION CHECKING

CROSS-REFERENCE TO RELATED APPLICATION

This application is based upon and claims the benefit of priority from Japanese Application No. 2021-092445, filed on Jun. 1, 2021, the entire contents of which are incorporated herein by reference.

FIELD

Embodiments described herein relate generally to a deterioration checking apparatus and a deterioration checking method.

BACKGROUND

Conventionally, a technology has been disclosed about a power supply circuit that uses a GaN (gallium nitride) transistor as a MOS transistor provided as an output transistor. Since the GaN transistor is high in breakdown voltage and low in loss, this transistor is suitable for application to a power supply circuit that outputs a high voltage.

An increase in the ON-resistance of a MOS transistor, which is provided as the output transistor of a power supply circuit, leads to an increase in the power consumption of the circuit.

Further, a change in the threshold voltage of the MOS transistor provided as the output transistor affects the ON/OFF controllability.

In addition, the ON-resistance and threshold voltage of MOS transistors change over time.

Therefore, it is desirable to have a deterioration checking apparatus and a deterioration checking method that make it possible to easily check the deterioration state of such a MOS transistor.

It is an object of one embodiment to provide a deterioration checking apparatus and a deterioration checking method that make it possible to easily check the deterioration state of such a MOS transistor.

Solution to Problem

DETAILED DESCRIPTION

According to one embodiment, a deterioration checking apparatus includes an inductor that is connected in series to a main current path of a MOS transistor to be checked, and forms a closed loop together with the MOS transistor when the MOS transistor is in an ON-state, a control circuit that controls ON/OFF of the MOS transistor, a current sensor that detects a current released from the inductor, and a calculation circuit that calculates an ON-resistance of the MOS transistor from an attenuation characteristic of a current released from the inductor when the MOS transistor is in an ON-state, and calculates a threshold voltage of the MOS transistor from an attenuation characteristic of a current released from the inductor when the MOS transistor is in an OFF-state.

Various Embodiments will be described hereinafter with reference to the accompanying drawings. Exemplary embodiments of a deterioration checking apparatus and a deterioration checking method will be explained below in detail with reference to the accompanying drawings. The present invention is not limited to the following embodiments.

First Embodiment

Figure 1:
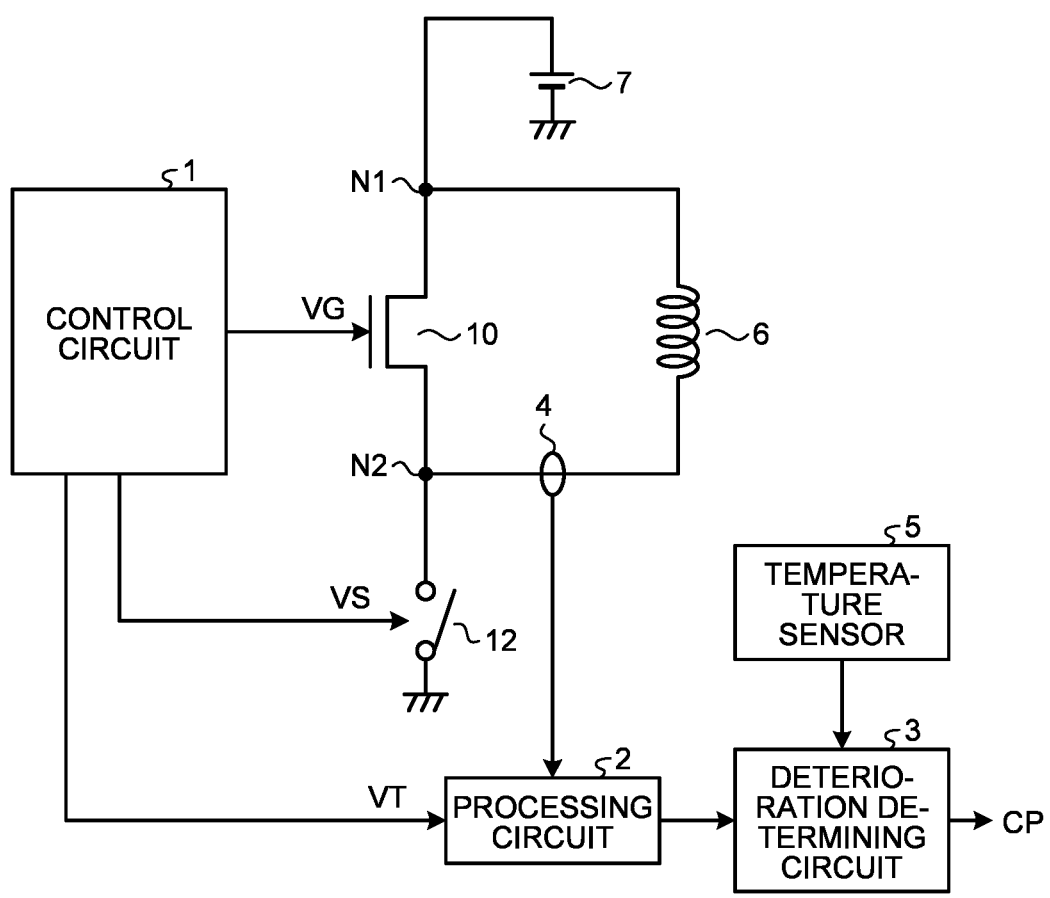
FIG. 1 is a diagram illustrating the configuration of a deterioration checking apparatus according to a first embodiment.

FIG. 1 is a diagram illustrating the configuration of a deterioration checking apparatus according to a first embodiment. A MOS transistor 10 is an N-channel type MOS transistor to be checked.

This embodiment includes an inductor 6 arranged such that one end is connected to a node N1 to which the drain of the MOS transistor 10 to be checked is connected, and the other end is connected to a node N2 to which the source of the MOS transistor 10 is connected. The inductor 6 is connected in series to the source-drain path, which is the main current path, of the MOS transistor 10, and forms a closed loop together with the MOS transistor 10 when the MOS transistor 10 is in the ON-state.

A power supply 7 is connected to the node N1. There is a switch 12 between the node N2 and ground.

This embodiment includes a control circuit 1 that controls the ON/OFF of the MOS transistor 10. The control circuit 1 supplies a drive signal VG to the gate of the MOS transistor 10, and thereby controls the ON/OFF of the MOS transistor 10. The control circuit 1 supplies a control signal VS to the switch 12. The control circuit 1 controls the ON/OFF of the switch 12 by the control signal VS. The ON/OFF of the switch 12 operated under the control of the control circuit 1 is used to control a reflux current that is refluxed through the closed loop formed by the MOS transistor 10 and the inductor 6. The control over the reflux current by the control circuit 1 will be described later. The control circuit 1 supplies a processing circuit 2 with a timing signal VT that indicates the timing of outputting the drive signal VG and the control signal VS.

In the configuration described above, the control circuit 1 may be arranged together with a control circuit for controlling an output transistor in a case where the MOS transistor 10 to be checked is provided as the output transistor. Alternatively, the control circuit 1 may be arranged as a component of a deterioration checking apparatus that is externally attached to the MOS transistor 10 provided as an output transistor.

This embodiment includes a current sensor 4. The current sensor 4 detects a current released from the inductor 6. The detection signal of the current sensor 4 is supplied to the processing circuit 2.

The processing circuit 2 functions as a calculation circuit, and calculates the ON-resistance $R_{ON}$ of the MOS transistor 10 on the basis of the attenuation characteristic of a current released from the inductor 6 when the MOS transistor 10 is in the ON-state. Further, the processing circuit 2 calculates the threshold voltage $V_{th}$ of the MOS transistor 10 on the basis of the attenuation characteristic of a current released from the inductor 6 when the MOS transistor 10 is in the OFF-state. The processing circuit 2 includes, for example, a Central Processing Unit (CPU) (not illustrated) that performs arithmetic processing and a memory (not illustrated) that stores arithmetic results.

This embodiment includes a temperature sensor 5 that detects the temperature of the MOS transistor 10. The detection signal of the temperature sensor 5 is supplied to a deterioration determining circuit 3.

The deterioration determining circuit 3 compares the ON-resistance $R_{ON}$ and threshold voltage $V_{th}$ of the MOS transistor 10 calculated by the processing circuit 2 with the respective thresholds of the ON-resistance $R_{ON}$ and threshold voltage $V_{th}$ set in advance, and thereby determines the deterioration state of the MOS transistor 10. The deterioration determining circuit 3 determines that a deterioration has been caused in the MOS transistor 10, for example, when the ON-resistance $R_{ON}$ exceeds a permissible range of resistance value with respect to a predetermined threshold, or when the threshold voltage $V_{th}$ exceeds a permissible range of voltage value with respect to a predetermined threshold.

The ON-resistance $R_{ON}$ and/or threshold voltage $V_{th}$ of the MOS transistor 10 change depending on the temperature of the MOS transistor 10. Therefore, the thresholds for determining the deterioration of the MOS transistor 10 are stored in a predetermined table (not illustrated) of the deterioration determining circuit 3 as values in correlation with temperature, for example, and are compared with arithmetic results from the processing circuit 2, on the basis of the detection signal of the temperature sensor 5, in the deterioration determining circuit 3.

Each of the arithmetic results from the processing circuit 2 and the determination results based on the comparison with the thresholds is output from the determination circuit 3 as a determination signal CP. For example, when each of the values of the ON-resistance $R_{ON}$ and threshold voltage $V_{th}$ of the MOS transistor 10 from the processing circuit 2 falls within a predetermined range with respect to a threshold set in advance, the MOS transistor 10 is determined to have no deterioration. However, when at least one of the values does not fall within the predetermined range, the MOS transistor 10 is determined to have a deterioration.

Next, with reference to FIGS. 2 to 4, an explanation will be given of a method for detecting the ON-resistance $R_{ON}$ and threshold voltage $V_{th}$ of the MOS transistor 10.

Figure 2:
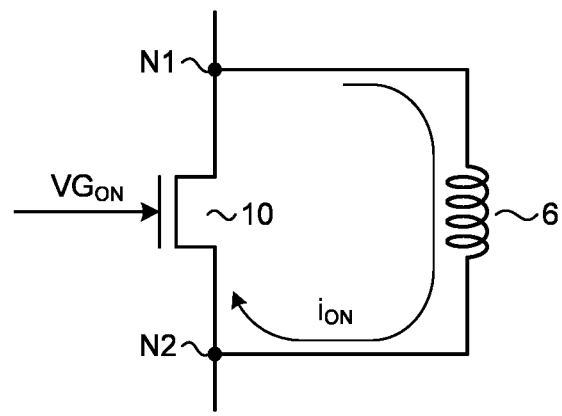
FIG. 2 is a diagram for explaining a reflux current when a transistor is in the ON-state.

FIG. 2 is a diagram for explaining a reflux current when the transistor is in the ON-state.

In the embodiment of FIG. 1, when the switch 12 is changed from the ON-state to the OFF-state by the control signal VS from the control circuit 1, and a drive signal $VG_{ON}$ is supplied to the MOS transistor 10 to turn on the MOS transistor 10, since the inductor 6 tries to keep the present state of a current and to keep the current flowing, a reflux current $i_{ON}$ flows through the closed loop formed by the MOS transistor 10 and the inductor 6.

The power P released from the inductor 6 when the MOS transistor 10 is in the ON-state is expressed by P=(the ON-resistance $R_{ON}$ of the MOS transistor 10×the reflux current $i_{ON}^2$). The reflux current $i_{ON}$ is consumed by the voltage drop due to the MOS transistor 10. The power released from the inductor 6 per unit time is consumed as heat per unit time in the MOS transistor 10. The reflux current $i_{ON}$ is a current released from the inductor 6 and is expressed by a formula (1).

[Formula 1]

$$i_{ON} = I_O \cdot e^{-\frac{R_{LOOP}}{L}t} \quad (1)$$

Here, Io is the initial value of the reflux current $i_{ON}$, L is the inductance of the inductor 6, and $R_{LOOP}$ is the total value of the resistance values of the closed loop formed by the MOS transistor 10 and the inductor 6. This $R_{LOOP}$ includes the ON-resistance $R_{ON}$ of the MOS transistor 10 and the parasitic resistance $R_L$ of the inductor 6. The $i_{ON}$ expressed by the formula (1) exhibits an attenuation characteristic. The initial value Io of the reflux current $i_{ON}$ can be measured by the current sensor 4 in response to the timing signal VT supplied from the control circuit 1. The initial value Io of the reflux current $i_{ON}$ can be adjusted in value by adjusting the ON-time of the switch 12.

Figure 3:
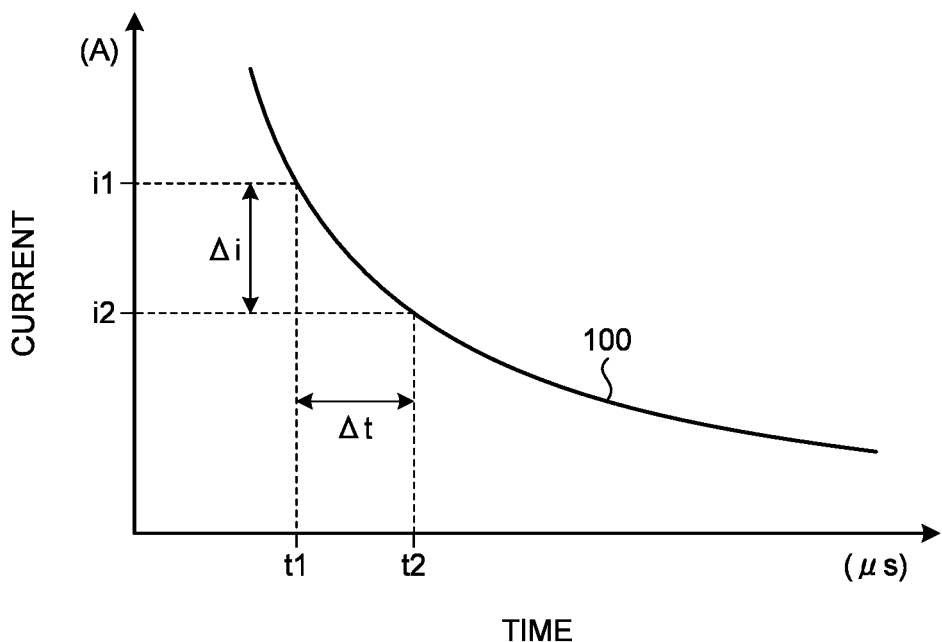
FIG. 3 is a diagram for explaining the attenuation characteristic of the reflux current.

FIG. 3 is a diagram for explaining the attenuation characteristic of the reflux current.

The solid line 100 indicates the reflux current $i_{ON}$. When the formula (1) set out above is differentiated with respect to time t, $R_{LOOP}/L$ is obtained as a coefficient. The differentiation of the formula (1) is equivalent to obtaining the inclination of the reflux current $i_{ON}$. Therefore, as shown in FIG. 3, a current change value Δi from a current value i1 to i2 of the reflux current $i_{ON}$ is obtained in a time difference Δt from a predetermined time point t1 to t2 of the reflux current $i_{ON}$, and thereby the coefficient $R_{LOOP}/L$ of the inclination of the reflux current $i_{ON}$ can be calculated.

When a known value of the inductor 6 is used as the value of L, and the value of the parasitic resistance of the inductor 6 is subtracted from the value of $R_{LOOP}$ the ON-resistance $R_{ON}$ of the MOS transistor 10 can be calculated.

The reflux current $i_{ON}$ actually measured by using the current sensor 4 is compared with the simulation data of the reflux current $i_{ON}$ calculated by using the coefficient $R_{LOOP}/L$ obtained from the attenuation characteristic of the reflux current $i_{ON}$, and fitting is performed to minimize the difference therebetween. With this operation, the accuracy in calculation of the ON-resistance $R_{ON}$ of the MOS transistor 10 can be improved. The calculation and fitting of the difference can be performed in the processing circuit 2.

Figure 4:
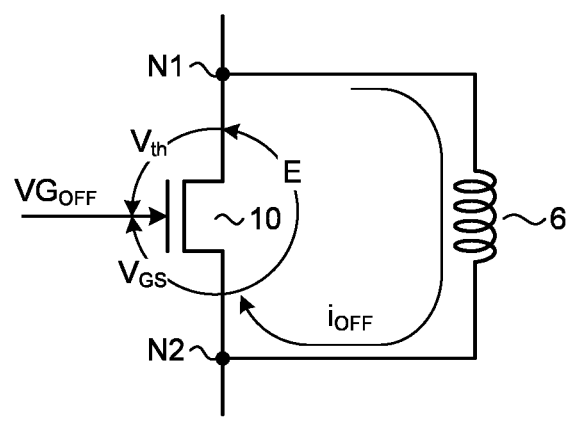
FIG. 4 is a diagram for explaining a reflux current when the transistor is in the OFF-state.

FIG. 4 is a diagram for explaining a reflux current when the MOS transistor 10 is in the OFF-state. Under a state where the reflux current $i_{ON}$ is flowing in the closed loop formed by the MOS transistor 10 and the inductor 6, when a drive signal $VG_{OFF}$ is supplied from the control circuit 1 to the gate of the MOS transistor 10 to turn off the MOS transistor 10, a reflux current $i_{OFF}$ flows through the closed loop formed by the MOS transistor 10 and the inductor 6. The power P released from the inductor 6 when the MOS transistor 10 is in the OFF-state is expressed by P=(the threshold voltage $V_{th}$ of the MOS transistor 10×the reflux current $i_{OFF}$). Further, the reflux current $i_{OFF}$ when the MOS transistor 10 is in the OFF-state is expressed by a formula (2).

[Formula 2]

$$i_{OFF} = \frac{V_{GS} - V_{th}}{R_{LOOP}} + \left(I_O - \frac{V_{GS} - V_{th}}{R_{LOOP}}\right) \cdot e^{-\frac{R_{LOOP}}{L} \cdot t} \quad (2)$$

Here, $V_{GS}$ is the voltage between the gate and source of the MOS transistor 10, and $V_{th}$ is the threshold voltage of the MOS transistor 10. The reflux current $i_{OFF}$ expressed by the formula (2) exhibits an attenuation characteristic. Here, in the formula (2), Io is the initial value of the reflux current $i_{OFF}$.

As a property of the MOS transistor 10, when a current is injected from the source side, even if the gate potential is lowered to be equal to or lower than the threshold voltage $V_{th}$, since the drain potential is lowered by the current supplied from the source side, and the gate potential seen from the drain rises to be equal to or higher than the threshold voltage $V_{th}$ and causes a current to flow. That is, the MOS transistor 10 has a property in which the source functions as a drain and the drain functions as a source, in a symmetrical and reversible way centering on the gate. This reversible function property is possessed by the so-called planar-type lateral MOS transistor in which the source and drain are formed on the surface of a semiconductor substrate (not illustrated). When this reversible function property is utilized, the voltage between the gate and drain of the MOS transistor 10 can be calculated as the threshold voltage $V_{th}$, and used as an index to determine the deterioration state of the MOS transistor 10.

The reflux current $i_{OFF}$ flowing through the MOS transistor 10 flows in accordance with the current formula of the saturation region of the MOS transistor 10, and a voltage E of about the threshold voltage $V_{th}$ is generated between the source and drain of the MOS transistor 10. This voltage E is a voltage necessary for the MOS transistor 10 to turn on, and the MOS transistor 10 can be regarded as a constant voltage source while the reflux current $i_{OFF}$ is flowing. The reflux current $i_{OFF}$ is consumed by the voltage drop due to the MOS transistor 10. The power released from the inductor 6 per unit time is consumed as heat per unit time in the MOS transistor 10.

As in the case of the attenuation characteristic of the reflux current $i_{ON}$ described above, when the formula (2) is differentiated with respect to time t, coefficients including (Io−($V_{GS}$−$V_{th}$)/$R_{LOOP}$) and $R_{LOOP}$/L, are obtained. The differentiation of the formula (2) is equivalent to obtaining the inclination of the reflux current $i_{OFF}$. Therefore, as in the case of the reflux current $i_{ON}$ shown in FIG. 3, a change value Δi of the reflux current $i_{OFF}$ in a predetermined time difference Δt is obtained, and thereby the inclination of the reflux current $i_{OFF}$ can be calculated. The initial value Io of the reflux current $i_{OFF}$ can be measured by the current sensor 4 in response to the timing signal VT supplied from control circuit 1.

When a known value of the inductor 6 is used as the value of L, and the value of the parasitic resistance of the inductor 6 is subtracted from the value of $R_{LOOP}$, the ON-resistance $R_{ON}$ of the MOS transistor 10 can be calculated. Here, as the value of the ON-resistance $R_{ON}$ of the MOS transistor 10, a value obtained from the attenuation characteristic of the reflux current $i_{ON}$ can be used, as described above.

The voltage $V_{GS}$ between the gate and source of the MOS transistor 10 is expressed by the voltage difference between the drive signal $VG_{OFF}$ applied to the gate of the MOS transistor 10 and the voltage at the node N2. The voltage at the node N2 is determined by the voltage of the power supply 7. An arithmetic operation is performed by using the calculated inclination of the reflux current $i_{OFF}$, the initial value Io, $R_{LOOP}$, L, and $V_{GS}$, and so the threshold voltage $V_{th}$ can be calculated. Here, when the attenuation characteristic of the reflux current $i_{OFF}$ is used to determine the deterioration state of the MOS transistor 10, since the parameters to be obtained as unknown values are the ON-resistance $R_{ON}$ and threshold voltage $V_{th}$ of the MOS transistor 10, values at three or more points are measured from the attenuation characteristic of the reflux current $i_{OFF}$, and two or more inclinations are calculated in the attenuation characteristic of the reflux current $i_{OFF}$.

Also when the threshold voltage $V_{th}$ of the MOS transistor 10 is calculated from the attenuation characteristic of the reflux current $i_{OFF}$, the value of the reflux current $i_{OFF}$ actually measured by using the current sensor 4 is compared with the simulation data of the reflux current $i_{OFF}$ calculated by using the coefficients including (Io−($V_{GS}$−$V_{th}$)/$R_{LOOP}$) and $R_{LOOP}$/L obtained from the attenuation characteristic of the reflux current $i_{OFF}$, and fitting is performed to minimize the difference therebetween. With this operation, the accuracy in calculation of the threshold voltage $V_{th}$ of the MOS transistor 10 can be improved. The calculation and fitting of the difference can be performed in the processing circuit 2.

Figure 5:
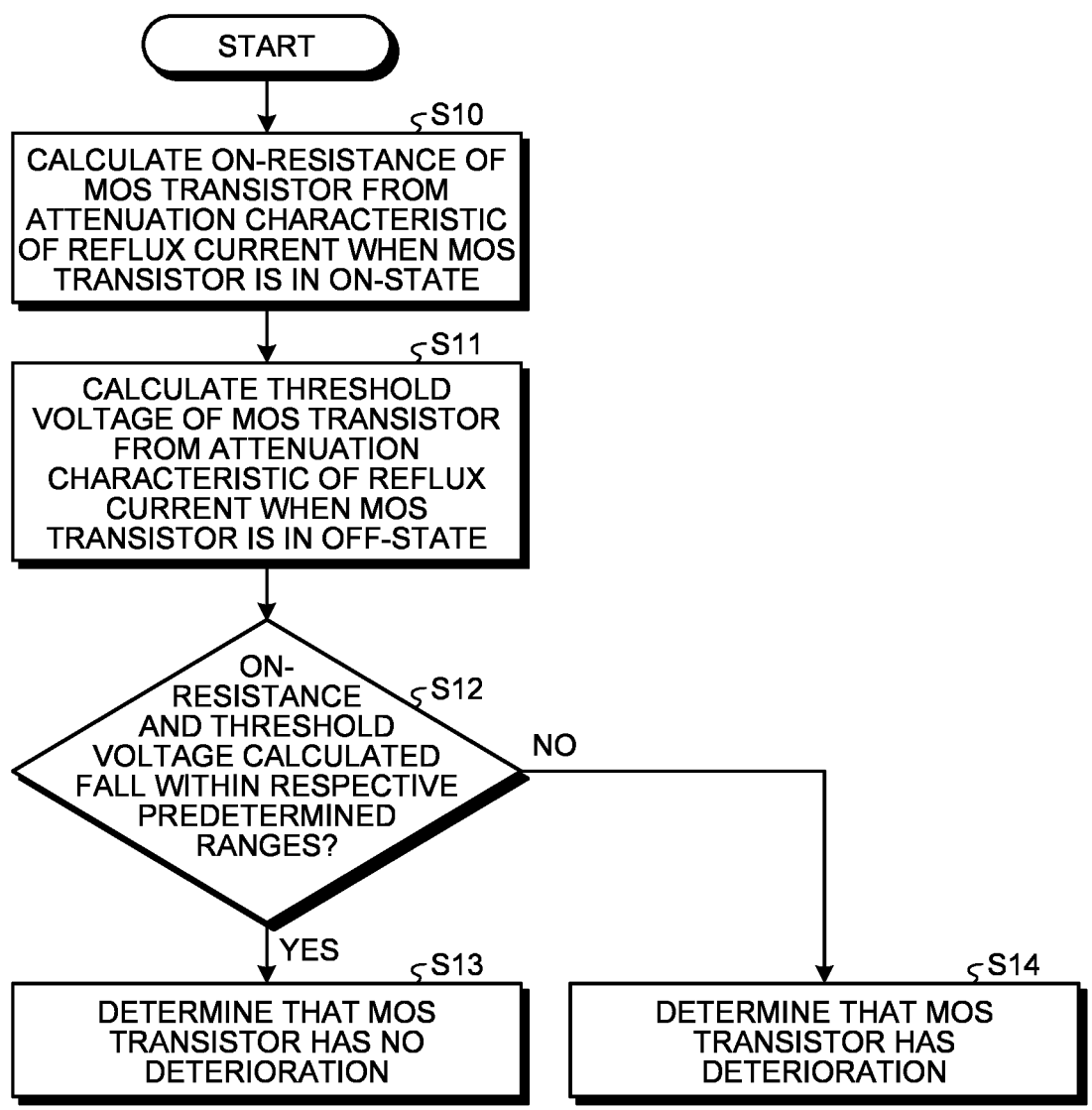
FIG. 5 is a flowchart illustrating one embodiment of a deterioration checking method.

FIG. 5 is a flowchart illustrating one embodiment of a deterioration checking method.

This flow chart is executed in the deterioration checking apparatus according to the first embodiment described above, in accordance with the method described with reference to FIGS. 2 to 4.

The ON-resistance $R_{ON}$ of the MOS transistor 10 is calculated from the attenuation characteristic of the reflux current $i_{ON}$ when the MOS transistor 10 is in the ON-state (S10). The method of obtaining the coefficient $R_{LOOP}$/L from the attenuation characteristic of the reflux current $i_{ON}$ and thereby calculating the ON-resistance $R_{ON}$ of the MOS transistor 10 is as described above.

The threshold voltage $V_{th}$ of the MOS transistor 10 is calculated from the attenuation characteristic of the reflux current $i_{OFF}$ when the MOS transistor 10 is in the OFF-state (S11). The method of obtaining the coefficient $R_{LOOP}$/L from the attenuation characteristic of the reflux current $i_{OFF}$ and thereby calculating the threshold voltage $V_{th}$ of the MOS transistor 10 is as described above.

Here, there may be another order such that first the threshold voltage $V_{th}$ of the MOS transistor 10 is calculated from the attenuation characteristic of the reflux current $i_{OFF}$ when the MOS transistor 10 is in the OFF-state, and then the ON-resistance $R_{ON}$ of the MOS transistor 10 is calculated from the attenuation characteristic of the reflux current $i_{ON}$ when the MOS transistor 10 is in the ON-state.

Subsequently, the deterioration determining circuit 3 determines whether the ON-resistance $R_{ON}$ and threshold voltage $V_{th}$ of the MOS transistor 10 calculated by the processing circuit 2 fall within respective predetermined ranges (S12). That is, each of the ON-resistance $R_{ON}$ and the threshold voltage $V_{th}$ obtained by calculation is compared with a predetermined threshold to determine whether to fall within the predetermined range.

When each of the ON-resistance $R_{ON}$ and the threshold voltage $V_{th}$ calculated by the processing circuit 2 falls within the predetermined range (S12: Yes), the deterioration determining circuit 3 determines that the MOS transistor 10 has no deterioration (S13). When one of the ON-resistance $R_{ON}$ and the threshold voltage $V_{th}$ calculated by the processing circuit 2 does not fall within the predetermined range (S12: No), the deterioration determining circuit 3 determines that the MOS transistor 10 has a deterioration (S14).

According to the first embodiment, the ON-resistance $R_{ON}$ and threshold voltage $V_{th}$ of the MOS transistor 10 are calculated from the attenuation characteristics of the reflux currents $i_{ON}$ and $i_{OFF}$, which are flowing through the closed loop formed by the MOS transistor 10 and the inductor 6, and are compared with the predetermined thresholds, by which the deterioration state of the MOS transistor 10 can be easily determined. Here, the predetermined thresholds used in the deterioration determining circuit 3 do not have to be values correlated with temperature. For example, each of the thresholds may be set as a threshold with a predetermined permissible range, and the temperature sensor 5 may be omitted.

Second Embodiment

Figure 6:
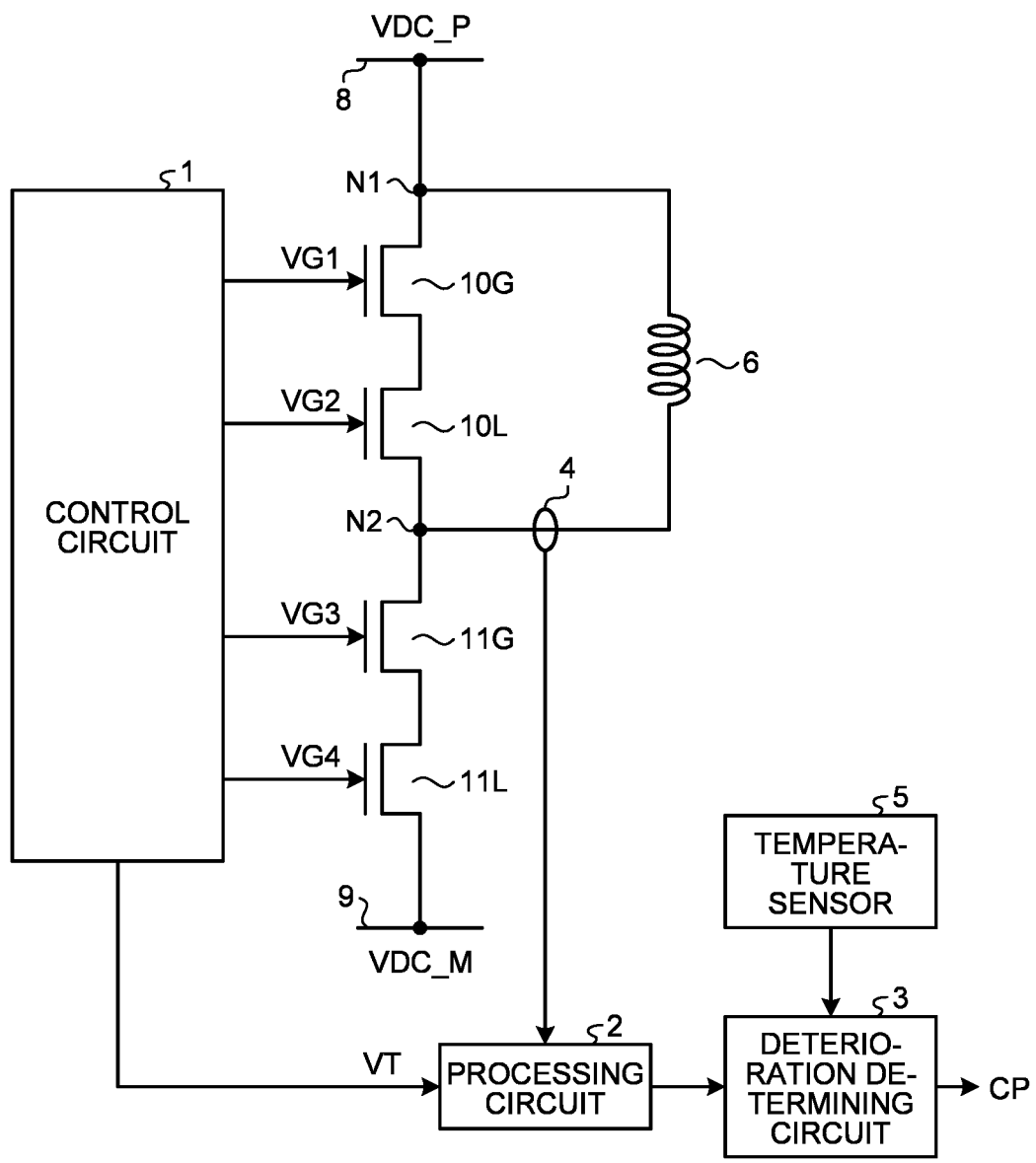
FIG. 6 is a diagram illustrating the configuration of a deterioration checking apparatus according to a second embodiment.

FIG. 6 is a diagram illustrating the configuration of a deterioration checking apparatus according to a second embodiment. In FIG. 6, the constituent elements corresponding to those of the embodiment described above are denoted by the same reference symbols, and their repetitive description will be made only when necessary. The same applies hereafter.

This embodiment includes a GaN (gallium nitride) transistor 10G and a switching transistor 10L made of silicon on the high side. The GaN transistor 10G is a MOS transistor of the normally-on type in which the main current path between the drain and source is made of GaN. The switching transistor 10L is a MOS transistor of the normal-off type. The GaN transistor 10G and the switching transistor 10L are connected in cascade.

The control circuit 1 supplies a drive signal VG1 to the gate of the GaN transistor 10G and supplies a drive signal VG2 to the gate of the switching transistor 10L. The drive signal VG1 is used to control the ON/OFF of the GaN transistor 10G, and the drive signal VG2 is used to control the ON/OFF of the switching transistor 10L. A power supply voltage VDC_P on the positive side is applied to a power supply line 8.

This embodiment includes a GaN transistor 11G and a switching transistor 11L made of silicon on the low side. The GaN transistor 11G and the switching transistor 11L are connected in cascade. The control circuit 1 supplies a drive signal VG3 to the gate of the GaN transistor 11G, and supplies a drive signal VG4 to the gate of the switching transistor 11L. The drive signal VG3 is used to control the ON/OFF of the GaN transistor 11G, and the drive signal VG4 is used to control the ON/OFF of the switching transistor 11L. A power supply voltage VDC_M on the negative side is applied to a power supply line 9.

This embodiment illustrates a case where the GaN transistors 10G and 11G, which are high in breakdown voltage and low in loss, are used as output transistors, in a DC/DC converter that converts a DC voltage applied to the power supply lines 8 and 9 to a predetermined DC voltage and outputs this voltage. The GaN transistor 10G and the switching transistor 10L on the high side and the GaN transistor 11G and the switching transistor 11L on the low side form a half bridge circuit. An inductor 6 is connected to a node N1 and has one end connected to a load (not illustrated) side in the DC/DC converter. When the deterioration of the high-side GaN transistor 10G is to be determined, the inductor 6 is connected to form a closed loop together with the GaN transistor 10G and the switching transistor 10L, as illustrated in FIG. 6.

Here, with reference to FIG. 7, an explanation will be given of a method of calculating the ON-resistance $R_{ON}$ and threshold voltage $V_{th}$ of the high-side GaN transistor 10G.

Figure 7:
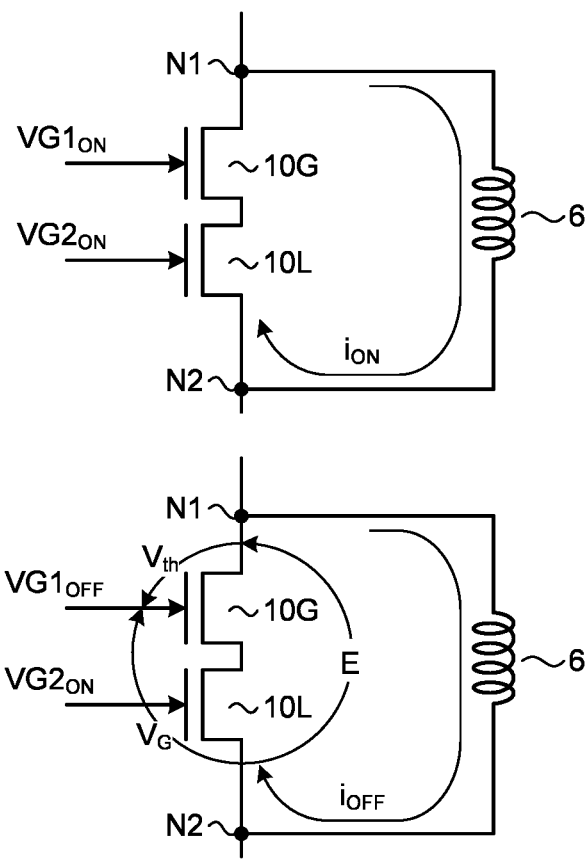
FIG. 7 is a diagram for explaining the relationship between the conduction state of a GaN transistor and the attenuation characteristic of a reflux current.

FIG. 7 is a diagram for explaining the relationship between the conduction state of the GaN transistor and the attenuation characteristic of a reflux current. The upper part of FIG. 7 illustrates a state where a reflux current $i_{ON}$ flows when the GaN transistor 10G and the switching transistor 10L are in the ON-state.

The reflux current $i_{ON}$ is a current released from the inductor 6, and is expressed by a formula (3). The reflux current $i_{ON}$ exhibits an attenuation characteristic.

[Formula 3]

$$i_{ON} = I_O \cdot e^{-\frac{R_{LOOP}}{L} \cdot t} \quad (3)$$

Here, Io is the initial value of the reflux current $i_{ON}$, L is the inductance of the inductor 6, and $R_{LOOP}$ is the resistance value of the closed loop formed by the GaN transistor 10G, the switching transistor 10L, and the inductor 6. This $R_{LOOP}$ includes the ON-resistances of the GaN transistor 10G and the switching transistor 10L, and the parasitic resistance $R_L$ of the inductor 6.

When the ON-resistance of the switching transistor 10L is ignored, the ON-resistance $R_{ON}$ of the GaN transistor 10G can be calculated from the attenuation characteristic of the reflux current $i_{ON}$, as in the embodiment 1 described above. Further, the reflux current $i_{ON}$ actually measured by using the current sensor 4 is compared with the simulation data of the reflux current $i_{ON}$ calculated by using the coefficient $R_{LOOP}/L$ obtained from the attenuation characteristic of the reflux current $i_{ON}$, and fitting is performed to minimize the difference therebetween. With this operation, the accuracy in calculation of the ON-resistance $R_{ON}$ of the GaN transistor 10G can be improved.

The lower part of FIG. 7 illustrates a state where a reflux current $i_{OFF}$ flows when the GaN transistor 10G is in the OFF-state and the switching transistor 10L is in the ON-state.

The reflux current $i_{OFF}$ is a current released from the inductor 6, and is expressed by a formula (4). Thus, the reflux current $i_{OFF}$ exhibits an attenuation characteristic.

[Formula 4]

$$i_{OFF} = \frac{V_G - V_{th}}{R_{LOOP}} + \left(I_O - \frac{V_G - V_{th}}{R_{LOOP}}\right) \cdot e^{-\frac{R_{LOOP}}{L} \cdot t} \quad (4)$$

Here, $V_G$ is the voltage between the gate of the GaN transistor 10G and a node N2, and $V_{th}$ is the threshold voltage of the GaN transistor 10G. The reflux current $i_{OFF}$ expressed by the formula (4) exhibits an attenuation characteristic.

As a property of the GaN transistor 10G formed as a lateral MOS transistor, when a current is injected from the source side, even if the gate potential is lowered to be equal to or lower than the threshold voltage $V_{th}$, since the drain potential is lowered by the current supplied from the source side, the gate potential seen from the drain rises to be equal to or higher than the threshold voltage $V_{th}$ and causes a current to flow. Due to a reversible function property in which the source functions as a drain and the drain functions as a source, a current flows through the GaN transistor 10G. That is, the reflux current $i_{OFF}$ flows. When this reversible function property is utilized, the voltage between the gate and drain of the GaN transistor 10G can be calculated as the threshold voltage $V_{th}$, and used as an index to determine the deterioration state of the GaN transistor 10G.

The reflux current $i_{OFF}$ flowing through the GaN transistor 10G flows in accordance with the current formula of the saturation region of the GaN transistor 10G, and a voltage E of about the threshold voltage $V_{th}$ is generated between the source and drain of the GaN transistor 10G. This voltage E is a voltage necessary for the GaN transistor 10G to turn on, and the GaN transistor 10G can be regarded as a constant voltage source while the reflux current $i_{OFF}$ is flowing. The reflux current $i_{OFF}$ is consumed by the voltage drop due to the GaN transistor 10G. The power released from the inductor 6 per unit time is consumed as heat per unit time in the GaN transistor 10G.

As in the case of the attenuation characteristic of the reflux current $i_{ON}$ described above, when the formula (4) is differentiated, $R_{LOOP}/L$ is obtained as a coefficient. The differentiation of the formula (4) is equivalent to obtaining the inclination of the reflux current $i_{OFF}$. Therefore, as in the case of the reflux current $i_{ON}$ shown in FIG. 3, a change value $\Delta i$ of the reflux current $i_{OFF}$ in a predetermined time difference $\Delta t$ is obtained, and thereby $R_{LOOP}/L$ representing the inclination of the reflux current $i_{OFF}$ can be calculated.

When a known value of the inductor 6 is used as the value of L, and the value of the parasitic resistance of the inductor 6 is subtracted from the value of $R_{LOOP}$, the ON-resistance $R_{ON}$ of the GaN transistor 10G can be calculated. Here, as the value of the ON-resistance $R_{ON}$ of the GaN transistor 10G, a value obtained from the attenuation characteristic of the reflux current $i_{ON}$ can be used, as described above. The voltage $V_{GS}$ between the gate and source of the GaN transistor 10G is expressed by the voltage difference between the drive signal $VG_{OFF}$ applied to the gate of the GaN transistor 10G and the voltage at the node N2. The voltage at the node N2 is set to, for example, 0V by the power supply voltages VDC_P and VDC_M applied to the power supply lines 8 and 9.

Figure 8:
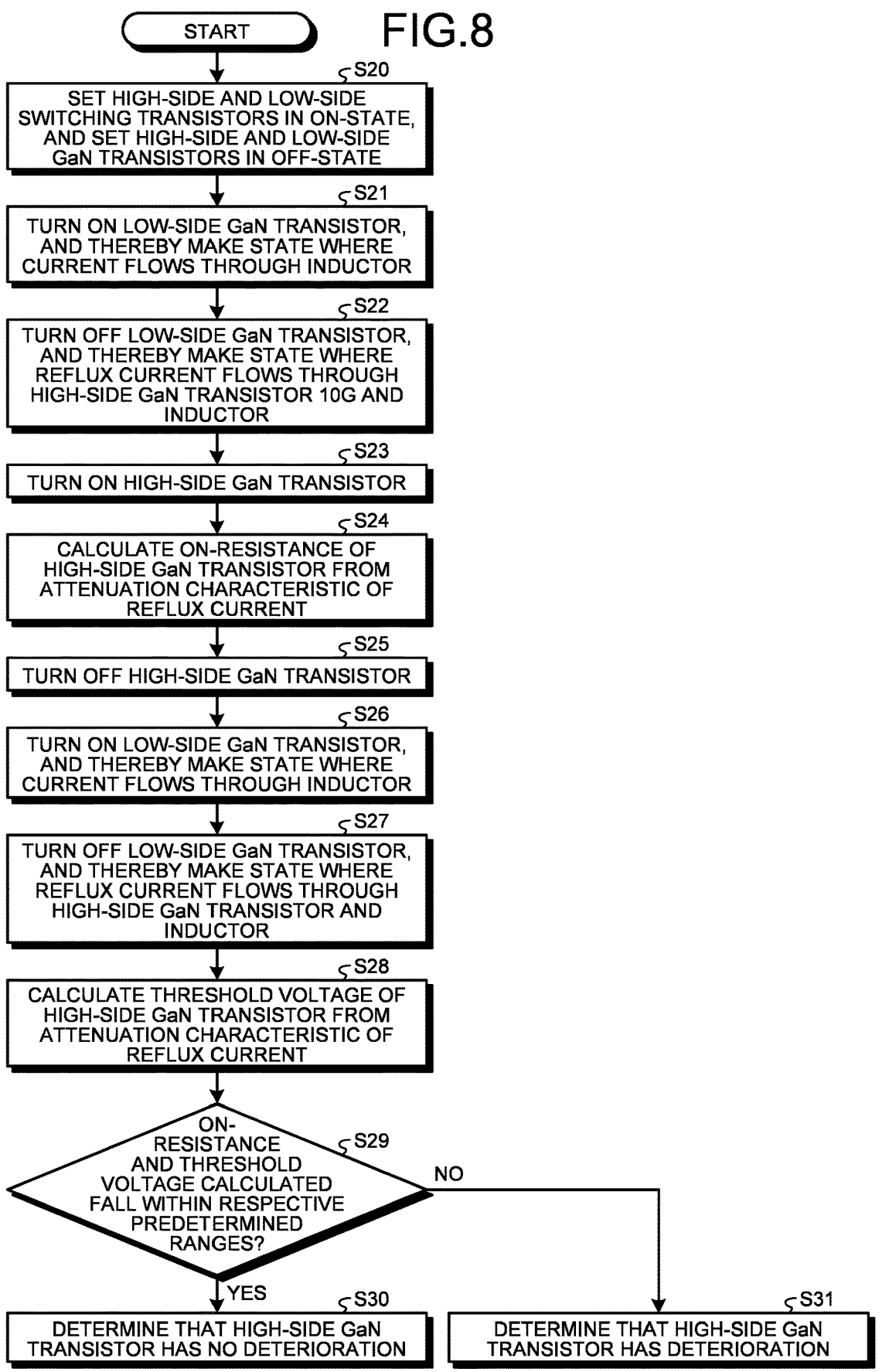
FIG. 8 is a flowchart illustrating another embodiment of a deterioration checking method.

FIG. 8 is a flowchart illustrating another embodiment of a deterioration checking method. This flow chart can be executed in the second embodiment described above.

The control circuit 1 sets the high-side and low-side switching transistors 10L and 11L in the ON-state, and sets the high-side and low-side GaN transistors 10G and 11G in the OFF-state (S20).

The control circuit 1 turns on the low-side GaN transistor 11G, and thereby makes a state where a current flows through the inductor 6 (S21). With this operation, a power is accumulated in the inductor 6. The initial value of the reflux current can be adjusted by adjusting the ON-time of the GaN transistor 11G.

The control circuit 1 turns off the low-side GaN transistor 11G, and thereby makes a state where a reflux current flows through the high-side GaN transistor 10G and the inductor 6 (S22).

The control circuit 1 turns on the high-side GaN transistor 10G (S23). That is, the control circuit 1 supplies the drive signal $VG1_{ON}$ to the gate of the GaN transistor 10G.

The processing circuit 2 calculates the ON-resistance $R_{ON}$ of the high-side GaN transistor 10G from the attenuation characteristic of the reflux current $i_{ON}$ (S24). As described above, the inclination of the attenuation characteristic of the reflux current $i_{ON}$ is obtained, and thereby the coefficient $R_{LOOP}/L$ can be calculated, concerning the inductance L as well as $R_{LOOP}$ including the ON-resistance $R_{ON}$.

The control circuit 1 turns off the high-side GaN transistor 10G (S25).

The control circuit 1 turns on the low-side GaN transistor 11G, and thereby makes a state where a current flows through the inductor 6 (S26). With this operation, a power is accumulated in the inductor 6.

The control circuit 1 turns off the low-side GaN transistor 11G, and thereby makes a state where a current flows through the high-side GaN transistor 10G and the inductor 6 (S27). That is, a state is made where a reflux current $i_{OFF}$ flows.

The processing circuit 2 calculates the threshold voltage $V_{th}$ of the high-side GaN transistor 10G from the attenuation characteristic of the reflux current $i_{OFF}$ (S28).

The deterioration determining circuit 3 determines whether the ON-resistance $R_{ON}$ and threshold voltage $V_{th}$ of the high-side GaN transistor 10G calculated by the processing circuit 2 fall within respective predetermined ranges (S29). That is, each of the ON-resistance $R_{ON}$ and the threshold voltage $V_{th}$ obtained by calculation is compared with a predetermined threshold to determine whether to fall within the predetermined range.

When each of the ON-resistance $R_{ON}$ and the threshold voltage $V_{th}$ calculated by the processing circuit 2 falls within the predetermined range (S29: Yes), the deterioration determining circuit 3 determines that the high-side GaN transistor 10G has no deterioration (S30). When one of the ON-resistance $R_{ON}$ and the threshold voltage $V_{th}$ thus calculated does not fall within the predetermined range (S29: No), the deterioration determining circuit 3 determines that the high-side GaN transistor 10G has a deterioration (S31).

According to the second embodiment, on the basis of the attenuation characteristics of the reflux currents $i_{ON}$ and $i_{OFF}$, which are flowing through the closed loop formed by the high-side GaN transistor 10G and the inductor 6, the deterioration state of the high-side GaN transistor 10G can be easily determined. The ON-resistance $R_{ON}$ and/or threshold voltage $V_{th}$ of the GaN transistor 10G change due to the current collapse during use. Since the deterioration checking apparatus according to this embodiment is configured to determine the deterioration state of the GaN transistor 10G by using the inductor 6 provided in the DC/DC converter, the configuration can be easily achieved.

Figure 9:
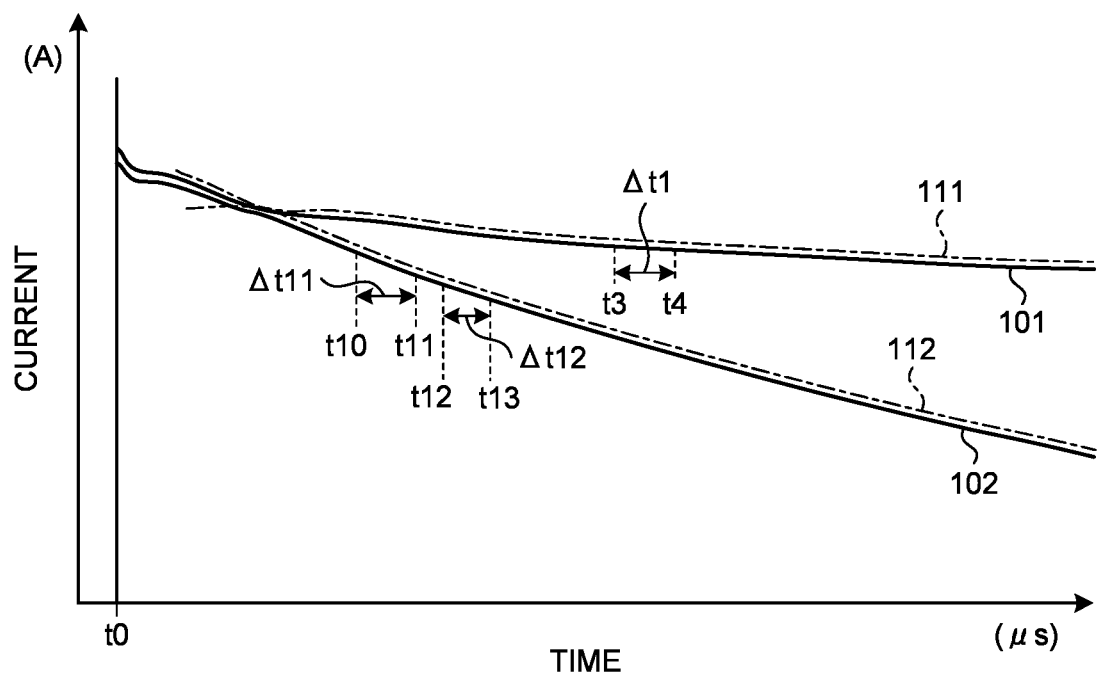
FIG. 9 is a diagram for explaining fitting between measured values of a reflux current and calculated data.

FIG. 9 is a diagram for explaining fitting between measured values of a reflux current and simulation data. This data fitting can be executed in the second embodiment. In FIG. 9, the horizontal axis indicates time and the vertical axis indicates current.

A solid line 101 indicates actually measured data of the attenuation characteristic of a reflux current $i_{ON}$ when the high-side GaN transistor 10G is set in the ON-state. This illustrates a case where the high-side GaN transistor 10G is turned on with timing delayed by a predetermined time from a time point t0 at which a state is made where the reflux current flows through the high-side GaN transistor 10G.

As described above, the reflux current $i_{ON}$ is attenuated in accordance with the attenuation characteristic expressed by the formula (3). Therefore, the processing circuit 2 calculates a change value Δi (not illustrated) of the reflux current $i_{ON}$ in a time difference Δt1 between arbitrary time points t3 and t4 to obtain the inclination of the attenuation characteristic of the reflux current $i_{ON}$. Consequently, the coefficient $R_{LOOP}/L$ can be calculated, concerning the inductance L as well as $R_{LOOP}$ including the ON-resistance $R_{ON}$ of the high-side GaN transistor 10G.

Further, the processing circuit 2 compares the actually measured data with the simulation data of the reflux current $i_{ON}$ calculated by using the coefficient $R_{LOOP}/L$ obtained from the attenuation characteristic of the reflux current $i_{ON}$, and performs fitting to minimize the difference therebetween. Here, this fitting is performed to minimize the difference between the simulation data indicated by a dashed line 111 and the actually measured data indicated by a solid line 101. With this operation, the accuracy in calculation of the ON-resistance $R_{ON}$ of the GaN transistor 10G can be improved. The calculation and fitting of the difference can be performed in the processing circuit 2.

A solid line 102 indicates actually measured data of the attenuation characteristic of a reflux current $i_{OFF}$ when the high-side GaN transistor 10G is set in the OFF-state. This illustrates a case where the low-side GaN transistor 11G is turned off at a time point t0 while the high-side GaN transistor 10G is set in the OFF-state.

As described above, the reflux current $i_{OFF}$ is attenuated in accordance with the attenuation characteristic expressed by the formula (4). Therefore, the processing circuit 2 calculates a change value Δi (not illustrated) of the reflux current $i_{OFF}$ in a time difference Δt11 between arbitrary time points t10 and t11 and a change value Δi (not illustrated) of the reflux current $i_{OFF}$ in a time difference Δt12 between arbitrary time points t12 and t13 to obtain inclinations of the attenuation characteristic of the reflux current $i_{OFF}$. Consequently, the threshold voltage $V_{th}$ of the high-side GaN transistor 10G can be calculated.

Further, the processing circuit 2 compares the actually measured data of the reflux current $i_{OFF}$ with the simulation data of the reflux current $i_{OFF}$ calculated by using the coefficient $R_{LOOP}/L$ obtained from the attenuation characteristic of the reflux current $i_{OFF}$, and performs fitting to minimize the difference therebetween. Here, this fitting is performed to minimize the difference between the simulation data indicated by a dashed line 112 and the actually measured data indicated by a solid line 102. With this operation, the accuracy in calculation of the threshold voltage $V_{th}$ of the GaN transistor 10G can be improved. The calculation and fitting of the difference can be performed in the processing circuit 2.

Third Embodiment

Figure 10:
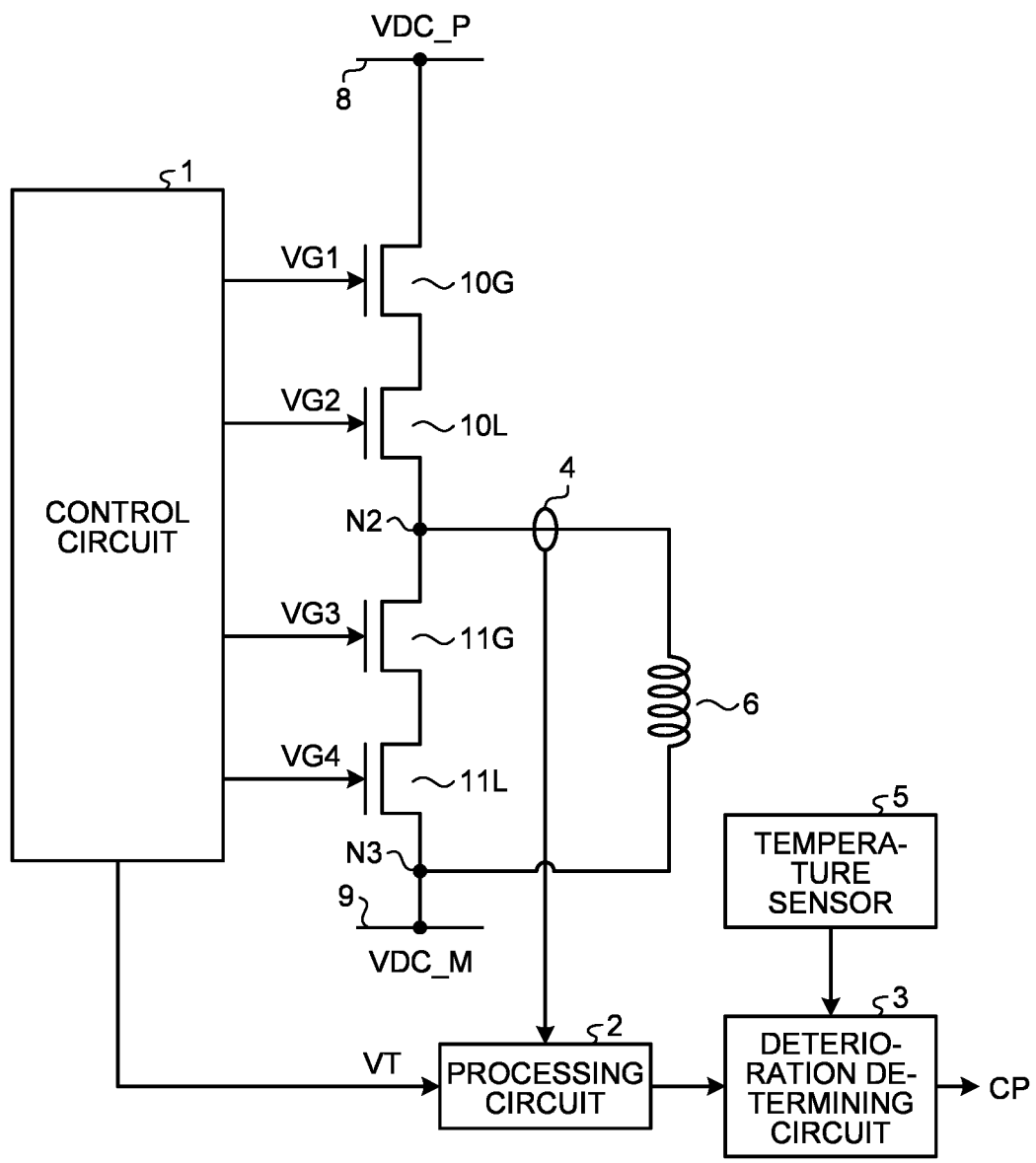
FIG. 10 is a diagram illustrating the configuration of a deterioration checking apparatus according to a third embodiment.

FIG. 10 is a diagram illustrating the configuration of a deterioration checking apparatus according to a third embodiment. This embodiment illustrates a case where the configuration is made to calculate the ON-resistance $R_{ON}$ and threshold voltage $V_{th}$ of the low-side GaN transistor 11G, and thereby check the deterioration state of the low-side GaN transistor 11G.

The GaN transistor 10G and the switching transistor 10L on the high side in the second embodiment described above respectively correspond to the GaN transistor 11G and the switching transistor 11L on the low side illustrated here. Under the control of the control circuit 1, the ON/OFF of the GaN transistors 10G and 11G and the switching transistors 10L and 11L is controlled, to calculate the ON-resistance $R_{ON}$ and threshold voltage $V_{th}$ of the low-side GaN transistor 11G, and thereby determine the deterioration state of the GaN transistor 11G.

According to this embodiment, one end on the load side of the inductor 6 provided in a DC/DC converter is connected to a node N3, and thereby a deterioration checking apparatus can be easily configured to determine the deterioration state of the low-side GaN transistor 11G provided in the DC/DC converter.

Fourth Embodiment

Figure 11:
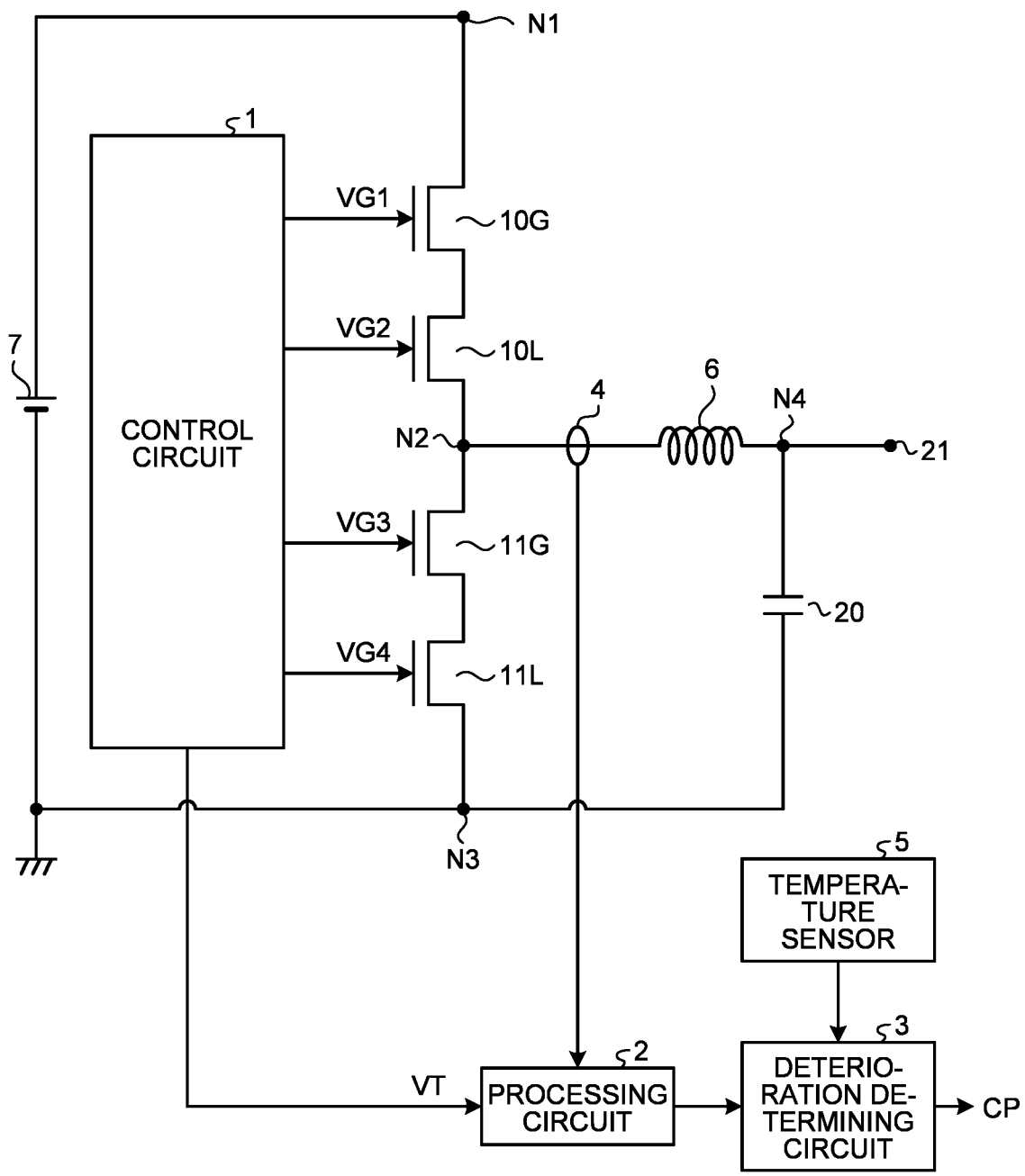
FIG. 11 is a diagram illustrating the configuration of a deterioration checking apparatus according to a fourth embodiment.

FIG. 11 is a diagram illustrating the configuration of a deterioration checking apparatus according to a fourth embodiment. This embodiment includes a smoothing capacitor 20 provided in a DC/DC converter. The smoothing capacitor 20 is connected between a node N4, to which one end of the inductor 6 is connected, and a node N3. The smoothing capacitor 20 smooths the voltage at the node N4 and supplies this voltage to the output end 21. The output voltage at the output end 21 is supplied to a load (not illustrated). A power supply 7 is connected between a node N1 and the node N3.

Figure 12:
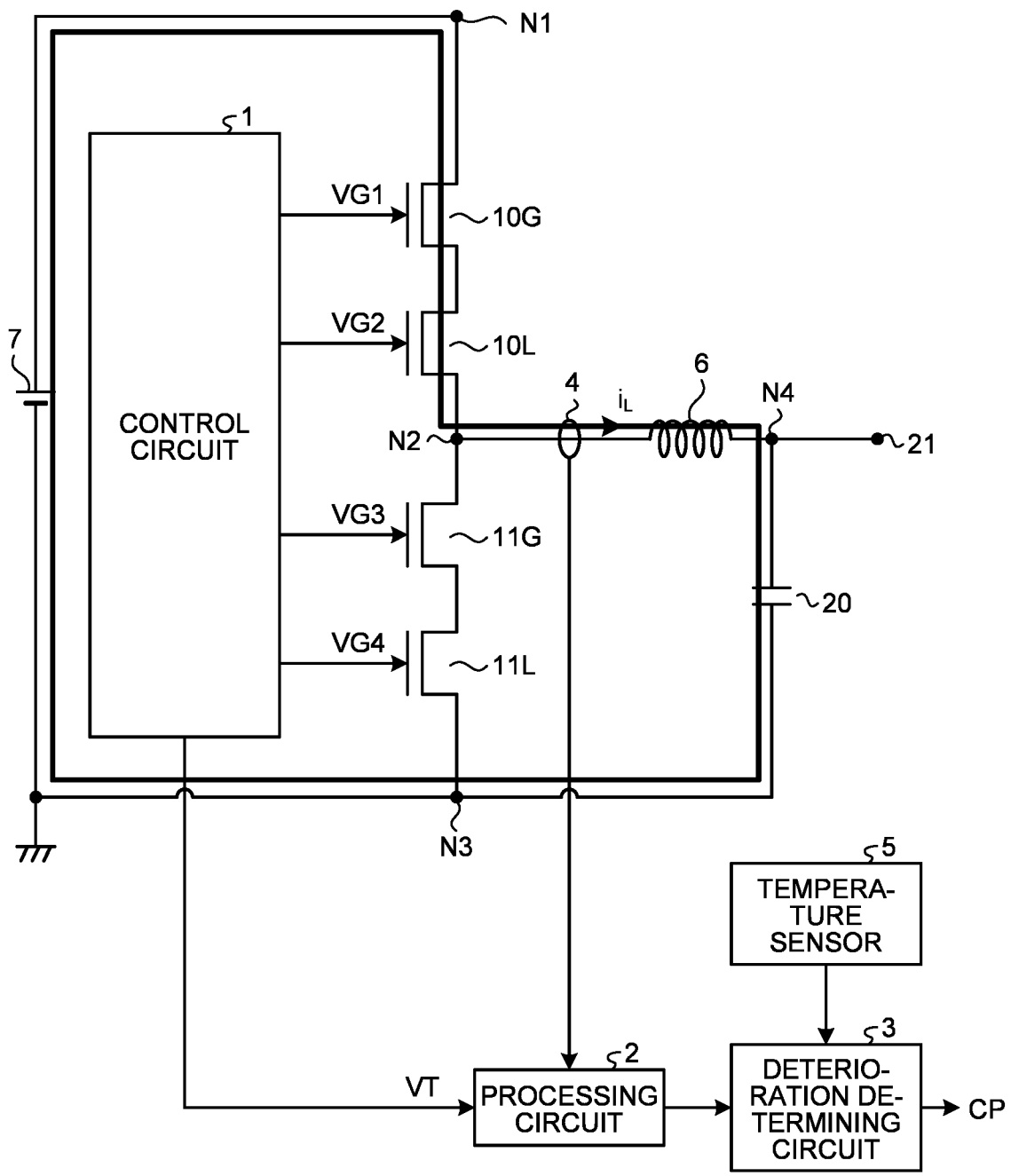
FIG. 12 is a diagram for explaining an inductor current when the deterioration state of a low-side GaN transistor is to be determined.
Figure 13:
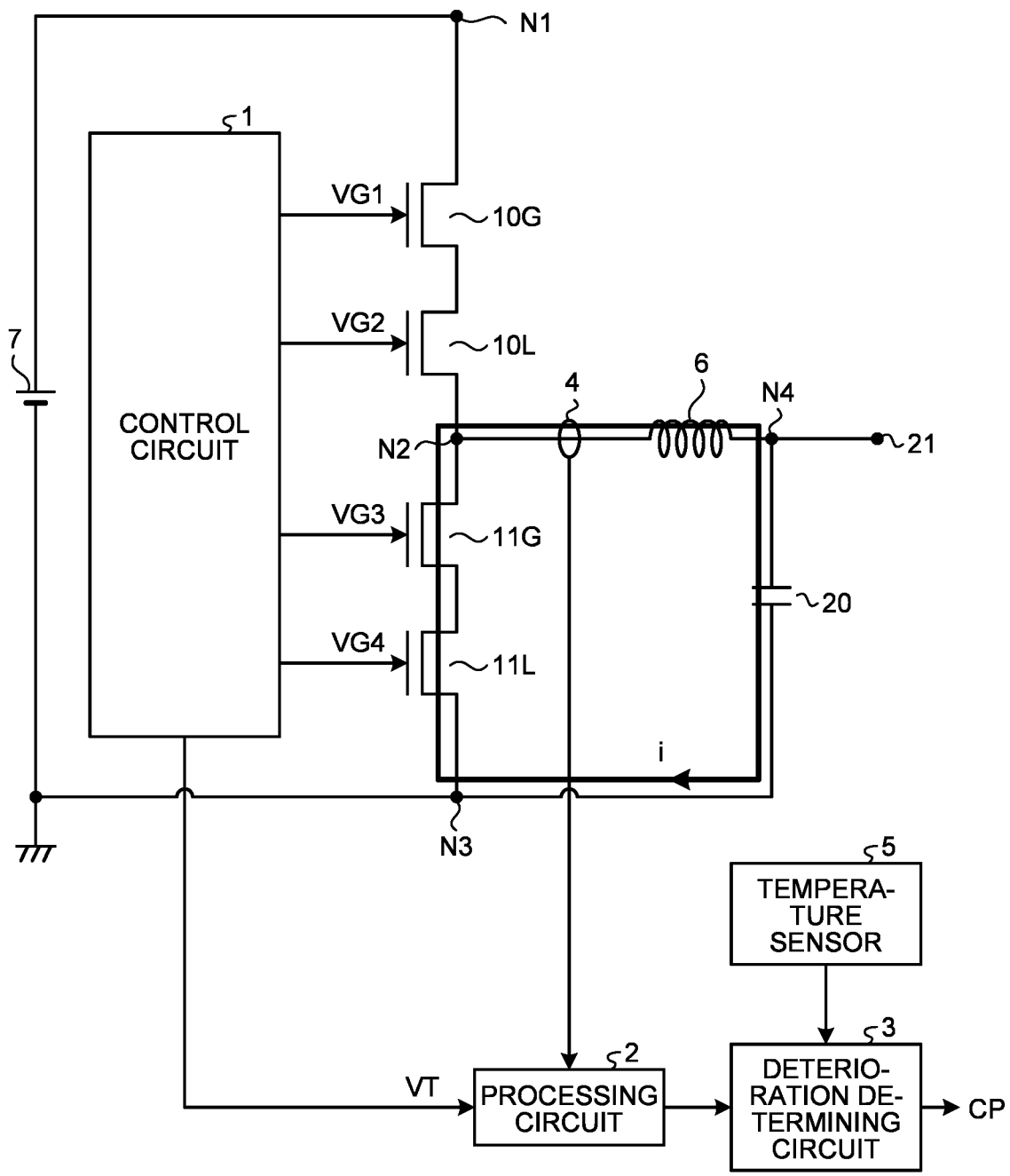
FIG. 13 is a diagram for explaining a reflux current when the deterioration state of the low-side GaN transistor is to be determined.

Here, with reference to FIGS. 12 and 13, an explanation will be given of a case where the deterioration state of the low-side GaN transistor 11G is determined. FIG. 12 is a diagram for explaining an inductor current $i_L$ when the deterioration state of the low-side GaN transistor 11G is to be determined. FIG. 13 is a diagram for explaining a reflux current "i" when the deterioration state of the low-side GaN transistor 11G is to be determined.

When the deterioration state of the low-side GaN transistor 11G is to be determined by the deterioration determining circuit 3, as illustrated in FIG. 12, the GaN transistor 11G and the switching transistor 11L on the low side are set in the OFF-state, and the GaN transistor 10G and the switching transistor 10L on the high side are set in the ON-state. With this setting, the inductor 6 is charged by an inductor current $i_L$ that flows through a loop formed by the power supply 7, the GaN transistor 10G and the switching transistor 10L on the high side, the inductor 6, and the smoothing capacitor 20.

Then, the GaN transistor 10G and the switching transistor 10L on the high side are set in the OFF-state by the control circuit 1, to make a state where, as illustrated in FIG. 13, when the GaN transistor 11G and the switching transistor 11L on the low side are set in the ON-state, a reflux current "i" released from the inductor 6 can flow through a closed loop formed by these transistors together with the inductor 6 and the smoothing capacitor 20.

As in the embodiments described above, under this state where the reflux current "i" can flow, the respective parts are operated under the control of the control circuit 1, and the following calculation is performed by the processing circuit 2. Specifically, the low-side GaN transistor 11G is turned on, and the ON-resistance $R_{ON}$ of the low-side GaN transistor 11G is calculated from the attenuation characteristic of a reflux current "i" flowing at this time. Further, the low-side GaN transistor 11G is turned off, and the threshold voltage $V_{th}$ of the low-side GaN transistor 11G is calculated from the attenuation characteristic of a reflux current "i" flowing at this time. Then, the deterioration state of the low-side GaN transistor 11G is determined by the deterioration determining circuit 3.

Figure 14:
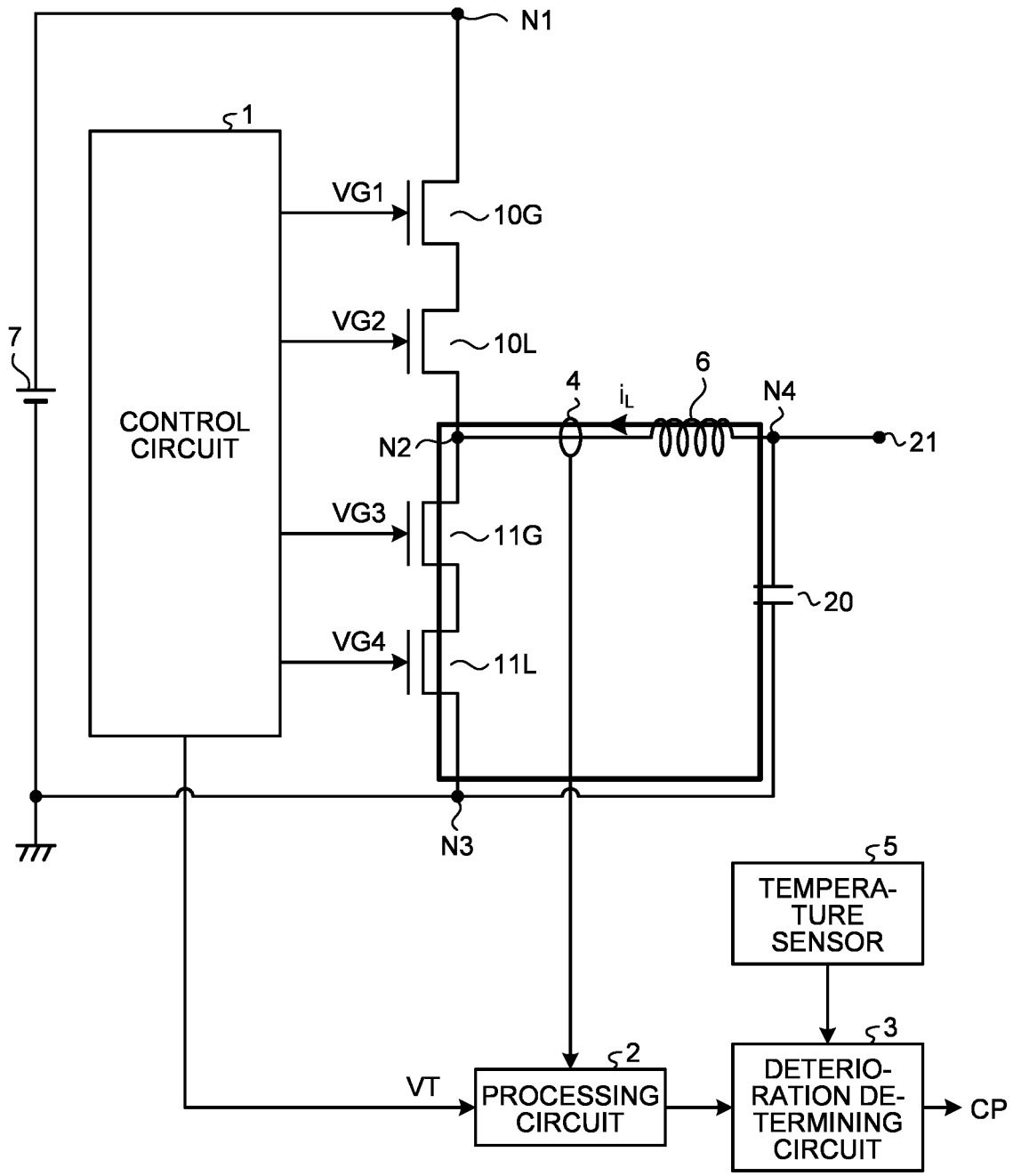
FIG. 14 is a diagram for explaining an inductor current when the deterioration state of a high-side GaN transistor is to be determined.
Figure 15:
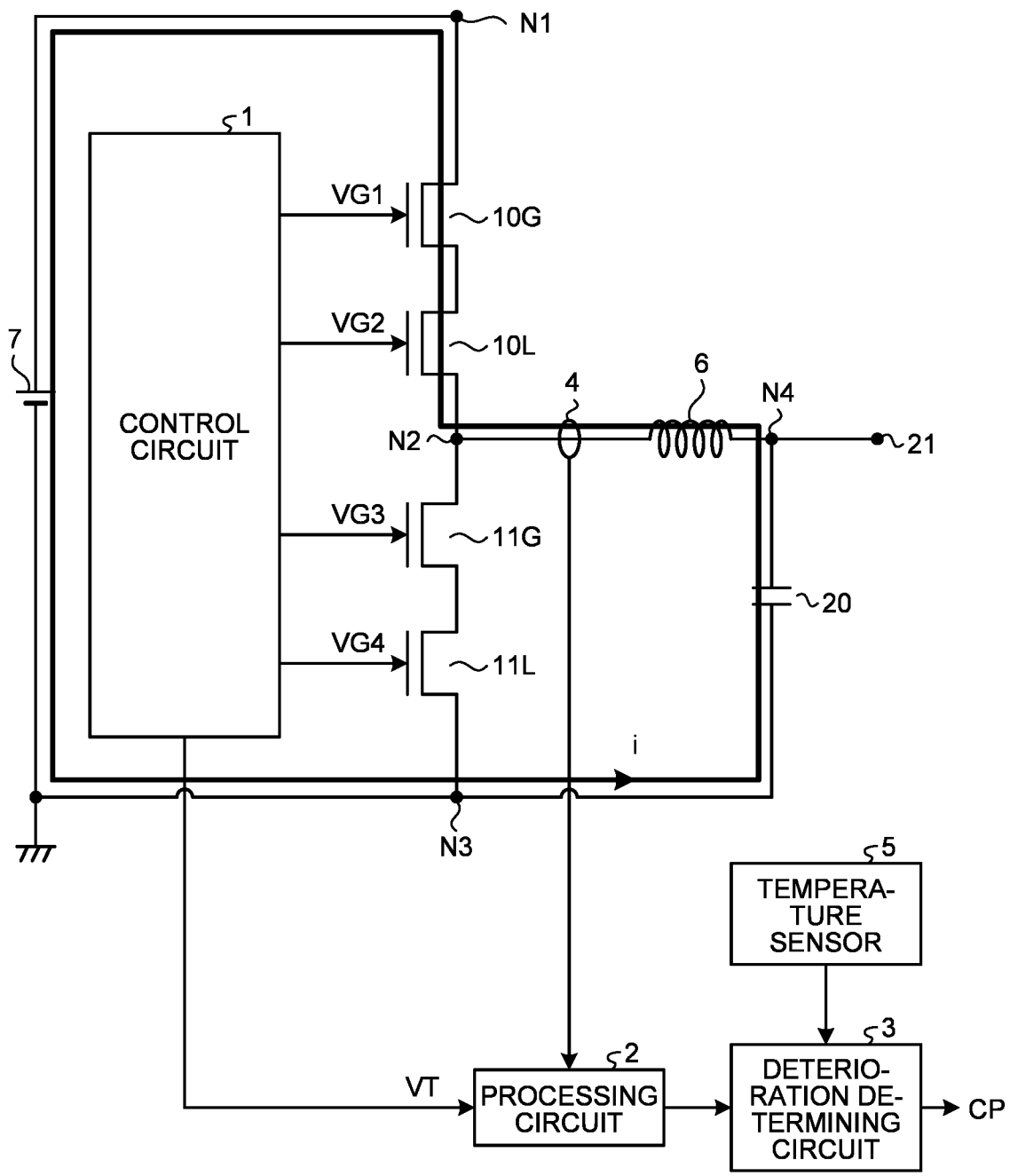
FIG. 15 is a diagram for explaining a reflux current when the deterioration state of the high-side GaN transistor is to be determined.

Next, with reference to FIGS. 14 and 15, an explanation will be given of a case where the deterioration state of the high-side GaN transistor 10G is determined. FIG. 14 is a diagram for explaining an inductor current $i_L$ when the deterioration state of the high-side GaN transistor 10G is to be determined. FIG. 15 is a diagram for explaining a reflux current "i" when the deterioration state of the high-side GaN transistor 10G is to be determined.

When the deterioration state of the high-side GaN transistor 10G is to be determined by the deterioration determining circuit 3, as illustrated in FIG. 14, the GaN transistor 10G and the switching transistor 10L on the high side are set in the OFF-state, and the GaN transistor 11G and the switching transistor 11L on the low side are set in the ON-state, by the control circuit 1. With this setting, the inductor 6 is charged by an inductor current $i_L$ that flows through a loop formed by the GaN transistor 11G and the switching transistor 11L on the low side, the inductor 6, and the smoothing capacitor 20. The inductor current $i_L$ is generated by discharge of electric charge from the smoothing capacitor 20. The smoothing capacitor 20 functions as a power supply.

Then, the GaN transistor 11G and the switching transistor 11L on the low side are set in the OFF-state, to make a state where, as illustrated in FIG. 15, when the GaN transistor 10G and the switching transistor 10L on the high side are set in the ON-state, a reflux current "i" released from the inductor 6 can flow through a closed loop formed by these transistors together with the inductor 6, the smoothing capacitor 20, and power supply 7. As in the embodiments described above, under this state where the reflux current "i" can flow, the respective parts are operated under the control of the control circuit 1, and the following calculation is performed by the processing circuit 2. Specifically, the high-side GaN transistor 10G is turned on, and the ON-resistance $R_{ON}$ of the high-side GaN transistor 10G is calculated from the attenuation characteristic of a reflux current "i" flowing at this time. Further, the high-side GaN transistor 10G is turned off, and the threshold voltage $V_{th}$ of the high-side GaN transistor 10G is calculated from the attenuation characteristic of a reflux current "i" flowing at this time. Then, the deterioration state of the high-side GaN transistor 10G is determined by the deterioration determining circuit 3.

According to this embodiment, it is possible to easily configure a deterioration checking apparatus used for determining the deterioration state of each of the high-side GaN transistor 10G and the low-side GaN transistor 11G, by using the configuration of the DC/DC converter including the smoothing capacitor 20 as it is.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A deterioration checking apparatus for a MOS transistor, the apparatus comprising:
    an inductor that is connected in series to a main current path of the MOS transistor to be checked, and forms a closed loop together with the MOS transistor when the MOS transistor is in an ON-state;
    a control circuit that controls ON/OFF of the MOS transistor;
    a current sensor that detects a current released from the inductor; and
    a processing circuit configured to:
        calculate an ON-resistance of the MOS transistor from an attenuation characteristic of the current released from the inductor when the MOS transistor is in an ON-state, and calculate a threshold voltage of the MOS transistor from an attenuation characteristic of the current released from the inductor when the MOS transistor is in an OFF-state; and
        determine a deterioration state of the MOS transistor by comparing an ON-resistance threshold and a threshold voltage threshold, which are set in advance, with the calculated ON-resistance and the calculated threshold voltage of the MOS transistor.

2. The deterioration checking apparatus according to claim 1, comprising a temperature sensor that detect a temperature of the MOS transistor.

3. The deterioration checking apparatus according to claim 2, wherein
    the processing circuit is configured to determine the deterioration state of the MOS transistor by comparing an ON-resistance threshold and a threshold voltage threshold, which are set in advance in correlation with the temperature of the MOS transistor, with the calculated ON-resistance and the calculated threshold voltage of the MOS transistor.

4. The deterioration checking apparatus according to any one of claims 1, 2 and 3, wherein the MOS transistor is a lateral MOS transistor.

5. The deterioration checking apparatus according to any one of claims 1, 2 and 3, wherein the MOS transistor is a GaN transistor.

6. A deterioration checking method for a MOS transistor, the method comprising:
    calculating an ON-resistance of the MOS transistor to be checked, which forms a closed loop together with an inductor, from an attenuation characteristic of a current released from the inductor when the MOS transistor is in an ON-state;
    calculating a threshold voltage of the MOS transistor from an attenuation characteristic of the current released from the inductor when the MOS transistor is in an OFF-state; and
    determining a deterioration state of the MOS transistor by comparing an ON-resistance threshold and a threshold voltage threshold, which are set in advance, with the calculated ON-resistance and the calculated threshold voltage of the MOS transistor.

7. The deterioration checking method according to claim 6, further comprising:
    detecting a temperature of the MOS transistor; and
    determining the deterioration state of the MOS transistor by comparing an ON-resistance threshold and a threshold voltage threshold, which are set in advance in correlation with the temperature of the MOS transistor, with the calculated ON-resistance and the calculated threshold voltage of the MOS transistor.

\* \* \* \* \*